(12) United States Patent
Saint-Patrice et al.

(10) Patent No.: US 9,908,773 B2
(45) Date of Patent: Mar. 6, 2018

(54) METHOD FOR PACKAGING A MICROELECTRONIC DEVICE IN A HERMETICALLY SEALED CAVITY AND MANAGING THE ATMOSPHERE OF THE CAVITY WITH A DEDICATED HOLE

(71) Applicants: COMMISSARIAT A L'ENERGIE ATOMIQUE ET AUX ENERGIES ALTERNATIVES, Paris (FR); EPCOS AG, Munich (DE)

(72) Inventors: Damien Saint-Patrice, Chabeuil (FR); Arnoldus Den Dekker, Beuningen (NL); Marcel Giesen, Munich (DE); Florent Greco, Seyssins (FR); Gudrun Henn, Ebenhausen (DE); Jean-Louis Pornin, Crolles (FR); Bruno Reig, Moirans (FR)

(73) Assignees: Commissariat à l'énergie atomique et aux énergies alternatives, Paris (FR); EPCOS AG, Munich (DE)

( * ) Notice: Subject to any disclaimer, the term of this patent is extended or adjusted under 35 U.S.C. 154(b) by 0 days.

(21) Appl. No.: 15/101,839

(22) PCT Filed: Dec. 6, 2013

(86) PCT No.: PCT/IB2013/002990
§ 371 (c)(1),
(2) Date: Jun. 3, 2016

(87) PCT Pub. No.: WO2015/082952
PCT Pub. Date: Jun. 11, 2015

(65) Prior Publication Data
US 2016/0304338 A1    Oct. 20, 2016

(51) Int. Cl.
*B81B 1/00* (2006.01)
*B81C 1/00* (2006.01)
*B81B 7/00* (2006.01)

(52) U.S. Cl.
CPC ........ *B81C 1/00277* (2013.01); *B81B 7/0035* (2013.01); *B81C 1/00293* (2013.01); *B81C 2203/0145* (2013.01)

(58) Field of Classification Search
None
See application file for complete search history.

(56) References Cited

U.S. PATENT DOCUMENTS

| 7,157,781 B2 | 1/2007 | Kawasaki et al. |
| 2002/0009869 A1* | 1/2002 | Cotte .................. H01L 24/11 438/612 |

(Continued)

FOREIGN PATENT DOCUMENTS

| CN | 102001616 A | 4/2011 |
| CN | 102745642 A | 10/2012 |

(Continued)

OTHER PUBLICATIONS

International Search Report and Written Opinion dated Jun. 17, 2014, in PCT/IB2013/002990 filed Dec. 6. 2013.

(Continued)

*Primary Examiner* — Charles Garber
*Assistant Examiner* — Alia Sabur
(74) *Attorney, Agent, or Firm* — Oblon, McClelland, Maier & Neustadt, L.L.P.

(57) ABSTRACT

A method for packaging a microelectronic device in an hermetically sealed cavity and managing an atmosphere of the cavity with a dedicated hole, including making said cavity between a support and a cap layer such that a sacrificial material and the device are arranged in the cavity;

(Continued)

removing the sacrificial material through at least one release hole, and hermetically sealing the release hole; making a portion of wettable material on the cap layer, around a blind hole or a part of said outside surface corresponding to a location of said dedicated hole; making a portion of fuse material on the portion of wettable material; making the dedicated hole by etching the cap layer; and reflowing the portion of fuse material with a controlled atmosphere, forming a bump of fuse material which hermetically plugs said dedicated hole.

14 Claims, 7 Drawing Sheets

(56) References Cited

U.S. PATENT DOCUMENTS

| | | |
|---|---|---|
| 2003/0215974 A1 | 11/2003 | Kawasaki et al. |
| 2006/0108675 A1 | 5/2006 | Colgan et al. |
| 2006/0144142 A1 | 7/2006 | Gogoi |
| 2007/0026559 A1* | 2/2007 | Haluzak ............ G02B 26/0833 438/50 |
| 2007/0218585 A1 | 9/2007 | Robert |
| 2007/0235501 A1* | 10/2007 | Heck ................. B81C 1/00293 228/101 |
| 2010/0028618 A1* | 2/2010 | Gonska .................... B81B 7/02 428/188 |
| 2010/0190301 A1* | 7/2010 | Delapierre .......... B81C 1/00293 438/124 |
| 2014/0008738 A1* | 1/2014 | Morris, III ............ B81B 7/0041 257/415 |

FOREIGN PATENT DOCUMENTS

| | | |
|---|---|---|
| CN | 202770456 U | 3/2013 |
| DE | 10 2011 103 516 A1 | 12/2012 |
| EP | 1 167 979 A2 | 1/2002 |
| EP | 2 213 616 A1 | 8/2010 |
| JP | 2008-221450 A | 9/2008 |
| JP | 2010-173063 A | 8/2010 |
| WO | WO 2013/071051 A | 5/2013 |

OTHER PUBLICATIONS

Combined Office Action and Search Report dated Feb. 21, 2017 in Chinese Patent Application No. 201380081445.0 (English translation only).

Notification of Reasons for Rejection issued in Japanese Patent Application No. 2016-536612 dated Aug. 1, 2017 with English Translation.

* cited by examiner

METHOD FOR PACKAGING A MICROELECTRONIC DEVICE IN A HERMETICALLY SEALED CAVITY AND MANAGING THE ATMOSPHERE OF THE CAVITY WITH A DEDICATED HOLE

TECHNICAL FIELD AND PRIOR ART

The invention relates a method for packaging at least one microelectronic device in at least one hermetically sealed cavity while managing the atmosphere of the cavity with at least one dedicated hole. Advantageously, the method according to the invention is carried out for packaging one or several microelectronic devices such as MEMS and/or MOEMS and/or NEMS and/or NOEMS devices, or any other device such that an acoustic-type or a sensor-type device, in one or several cavities and with controlled atmosphere.

Packaging specifications depend on the type of the microelectronic device to be encapsulated and its application. Generally, the packaging should allow movement of the device and should protect the device from damage of its moving parts mainly during back-end processes such as die sawing or injection moulding. Another function of the packaging is to manage the atmosphere (pressure and gas) inside of the cavity over lifetime of the device to guarantee the performance of the device.

A wide variety of microelectronic devices, especially MEMS devices, have to be hermetically packaged to maintain a specific atmosphere around the devices to secure a reliable operation of the devices and/or an operation of the devices within specifications. For instance, accelerometers and gyroscopes need a low pressure (between 10 and $10^{-3}$ mbar) inside the cavities in which these devices are encapsulated.

However, RF-MEMS switches need to work at a higher pressure to provide sufficient damping effect. For instance, a RF-MEMS switch generally needs to work at a pressure higher than around 100 mbar to generate sufficient damping force in order to minimize ringing effects when such device is in an open state and/or to generate a squeeze-film damping force when such switch closes in order to minimize the force of the impact of the closure. The nature of gas or gases of the atmosphere in which such device is encapsulated is controlled primary to ensure the reliability of the device. In case of RF-MEMS switch the cavity atmosphere has to be free of organic solvents and moisture to, for instance, avoid degradation of the Ohmic contact by frictional polymerization, or to avoid fast charging of the dielectric in case of electrostatic actuation. In general, inert gasses are most suitable for such application.

Two different possibilities are known for making such packaging. A first well known possibility named cap report consists of creating a cavity by micromachining in a cap wafer, for example, silicon-based, reporting it above a support wafer on which the device is arranged and finally performing a bonding process between the cap wafer and the support wafer. This bonding step can be performed with a controlled atmosphere (control of the pressure and of the nature of gas or gases of the atmosphere) in order to obtain said controlled atmosphere in the closed cavity in which the microelectronic device is encapsulated, but the high temperature of this process and the large silicon area required for bonding the two wafers are important drawbacks (some microelectronic devices are not compatible with such high temperature).

Thin Film Packaging (also named TFP, or Thin Film Capping) is a technology which enables to decrease package height, area, thermal budget and cost compared to a cap report packaging. During a TFP process, a cap is made by depositing one or several thin layers above a sacrificial layer which is then etched through release holes made through the cap in order to form a cavity in which the device is encapsulated.

With this technology, the challenge is to close hermetically the holes that are performed for the sacrificial layer release.

A polymer layer can be deposited above the cap to close the release holes. However, the obtained pressure in the closed cavity corresponds to the atmospheric pressure, and contaminants like oxygen, water, and organic gases are present inside the closed cavity because the atmosphere of the cavity cannot be managed independently during the deposition process of the polymer layer, for instance, a spin-on process or a film lamination process.

Alternately, a PSG (phosphorous-doped silicate glass) layer can be used to close the release holes made through the cap. However, a high temperature curing (i.e. 900° C.) is mandatory to reflow this PSG layer, such temperature being not compatible with some MEMS thermal budget.

Thus hermetic cavities with pressures over around 100 mbar, closed at room temperature and with a controlled nature of gases inside the cavities could not be made with these closing processes. Moreover, if the closing of the release holes involves a deposition of PVD (Physical Vapor Deposition), CVD (Chemical Vapor Deposition) or PECVD (Plasma Enhanced Chemical Vapor Deposition) type, the gases caught inside the cavity such as silane or TEOS for PECVD processes decrease the performances and/or the reliability of such packaging. Moreover, the pressure with which these deposition processes can be carried out is limited, for instance, between $10^{-3}$ mbar and 100 mbar.

Document DE 10 2011 103 516 A1 discloses the use of a laser to make an opening through the cap after the closing of the release holes in order to manage the atmosphere inside the cavity after the closing of the release holes. The use of such dedicated hole to manage the atmosphere of the cavity enables to release constraints linked with the sealing process of the release holes. However, the laser opening can generate particles inside the cavity and damage the MEMS device packaged inside the cavity. Moreover, as the laser heats the material of the cap around the hole such that this material flows to seal the hole, the stiffness of the cap around the hole is thus lowered and this decreases the reliability performance. Finally, the use of the laser to make holes is a unitary process (the holes have to be made one by one for each cavity), which thus have an important cost impact on this packaging process.

DESCRIPTION OF THE INVENTION

One aim of the invention is to provide a new method for packaging at least one microelectronic device in at least one hermetically sealed cavity which enables to manage the atmosphere of the cavity independently of the process carried out to close at least one release hole used to remove a sacrificial material during the making of the cavity without the previously described drawbacks of the cap report and TFP processes of the prior art, and also without the drawbacks involved by the use of a laser to make a hole dedicated to the management of the atmosphere.

The present invention thus proposes a method for packaging at least one microelectronic device in at least one hermetically sealed cavity and managing an atmosphere of the cavity with at least one dedicated hole, comprising at least the following steps:

making said cavity between a support and at least one cap layer such that a sacrificial material and the microelectronic device are arranged in the cavity;

removing the sacrificial material through at least one release hole made through the cap layer, and hermetically sealing the release hole;

making a portion of wettable material on the cap layer, around a blind hole intended to form said dedicated hole, said blind hole being made through an outside surface of the cap layer before the making of the portion of wettable material, or around a part of said outside surface of the cap layer corresponding to a location of said dedicated hole intended to be made;

making a portion of fuse material at least on the portion of wettable material;

making the dedicated hole by etching at least the cap layer either through a bottom wall of the blind hole or through said part of the outside surface of the cap layer, said dedicated hole emerging into the cavity;

reflowing the portion of fuse material with a controlled atmosphere, forming a bump of fuse material which hermetically plugs said dedicated hole, an atmosphere inside the cavity corresponding to said controlled atmosphere.

Thus the invention proposes a new packaging method in which a hole, which is distinct from at least one release hole used to remove the sacrificial material, enables to manage the atmosphere of the cavity after the closing of the release hole(s). Thus, the final atmosphere obtained in the cavity is not limited, in terms of pressure and/or nature of gas or gases, by the process carried out to close the release hole(s), the dedicated hole being hermetically plugged after the closing of the release hole(s). Moreover, by using a portion of fuse material which is reflowed to close the dedicated hole, it is possible to close the dedicated hole with a controlled atmosphere the pressure of which being not limited, for instance, between $10^{-6}$ mbar and 100 mbar. The reflowing of the portion of fuse material also avoids the presence of contaminants inside the cavity after this reflowing. The reflowing of a fuse material to close the dedicated hole also avoids the drawbacks involved by the use of a polymer layer, or a PSG layer, or by the implementation of a CVD, PECVD, or PVD process.

Moreover, the method of the invention avoids the use of a laser to make the dedicated hole, and thus avoids the generation of particles inside the cavity.

Moreover, compared to the use of a laser for sealing the hole, the method of the invention also avoids a deterioration of the stiffness of the cap around the dedicated hole as the material of the cap is not damaged by the process carried out to close the dedicated hole, that is the reflowing of the fuse material.

This packaging method is advantageously carried out at wafer level in order to hermetically seal several microelectronic devices in several cavities with pressure and gas management, without impacting the released microelectronic devices/structures and the cost of the packaging process.

The fuse material, also called fusible material or solder, corresponds to a fusible metal or a fusible alloy, that is a metal or metal alloy capable of being easily fused, i.e. easily meltable, at relatively low temperatures which are compatible with microelectronic processes. The value of the melting point of the fuse material depends on the nature of the fuse material. The fuse material may have a melting point, for example, between around 300° C. and 400° C. The fuse material may be an eutectic alloy and may be reflowed with a fluxless process.

The wettable material, that could be similar to the material of the upper layers of the stack named UBM (Under Bump Metallurgy) in flip-chip technology, may be defined in two points:

First, the wettable material is the material where the fuse material will be located after reflow, even if a part of the fuse material is deposited outside of it;

Secondly, the wettable material may be partially dissolved in the fuse material at reflow temperature, thus forming intermetallics and providing thereby the hermeticity and the attachment.

Generally, the wettable material may be a metal as, for example, gold, copper, platinum, or a stack of different materials, for example, TiNiAu or TiCu.

The portion of wettable material here corresponds to the surface to which the reflowed fuse material is fastened.

The controlled atmosphere corresponds to an atmosphere with a specific pressure and a specific gas composition. Said pressure and gas composition may be chosen according to the specifications required for encapsulation, or packaging, of the microelectronic device.

The making of the dedicated hole after the sealing of the release hole(s), instead of using one or several of the release holes to manage the atmosphere of the cavity, allows more flexibility in the further processing of the obtained structure without any impact on the microelectronic device and enables, in a later stage (after the closing of the release hole(s) and after the making of the portion of fuse material), such hole to be opened completely to manage the atmosphere of the cavity before a final hermetic sealing of the cavity.

Microelectronic (photolithography, wet and dry etching, stripping, etc.) and back-end steps can thus be carried out between the step of hermetically sealing the release hole(s), that is once the microelectronic device is released, and the step of making the dedicated hole with no risk of contamination inside the cavity because the cavity may be opened just before the step of reflowing the fuse material which is carried out at the desired atmosphere.

The blind hole or the part of the outside surface of the cap layer may be arranged in a peripheral area of the cavity such that the microelectronic device is not facing said peripheral area of the cavity. Such configuration enhances the protection of the microelectronic device during the implementation of the method. The making of the portion of wettable material may comprise the following steps:

deposition of a layer of wettable material on said outside surface of the cap layer;

etching a part of the layer of wettable material such that a remaining portion of the layer of wettable material corresponds to the portion of wettable material.

In this case, the etching of the part of the layer of wettable material may be carried out after the making of the portion of fuse material. Thus, it is possible to use the portion of fuse material as a mask for this etching step.

An adhesion layer may be first deposited on the outside surface of the cap layer before the deposition of the layer of wettable material which is then deposited on said adhesion layer.

Advantageously, the portion of fuse material may be made by electro-chemical deposition, and the adhesion layer may form a seed layer for the growth of the fuse material during the electro-chemical deposition. Alternately, a seed layer which don't correspond to the adhesion layer may be used for the growth of the fuse material during the electrochemical deposition of the portion of fuse material.

Moreover, also in this case, if the blind hole is made before the deposition of the layer of wettable material, the layer of wettable material may also be deposited against side walls and the bottom wall of the blind hole, said part of the layer of wettable material which is etched may also comprise the wettable material which covers the side walls and the bottom wall of the blind hole.

If the blind hole is made before the making of the portion of fuse material, said portion of fuse material may also be made in the blind hole, and the step of making the dedicated hole may also comprise the etching of the part of the portion of fuse material which is arranged in the blind hole. The making of the portion of fuse material may comprise the following steps:

deposition of a photo resist layer on the outside surface of the cap layer and on the portion of wettable material;
etching a part of the photo resist layer, forming an opening through the photo resist layer and located at least above the portion of wettable material;
and wherein the portion of fuse material may then be formed in said opening by deposition (lift-off), and wherein the photo resist layer may be removed after the making of the portion of fuse material.

The method may further comprise, when the portion of wettable material is made around the part of said outside surface of the cap layer corresponding to the location of said dedicated hole intended to be made, a step of making the blind hole through said part of the outside surface of the cap layer which is carried out between the step of making the portion of wettable material and the step of making the portion of fuse material.

Alternately, when no blind hole is made through the outside surface of the cap layer, the dedicated hole may be made by etching at least the cap layer, the portion of wettable material and the portion of fuse material. If an adhesion layer is arranged between the cap layer and the layer of wettable material, this adhesion layer may be also etched during the making of the dedicated hole.

The hermetically sealing of the release hole(s) may comprise the deposition of an hermetic layer above the cap layer and above the release hole(s), the portion of wettable material may be made on said hermetic layer and the dedicated hole may be made through said hermetic layer.

The step of making the cavity and the step of removing the sacrificial layer may be carried out such that these steps also makes at least a second cavity between the support and the cap layer and comprising hermetically at least one sealed second release hole.

The first cavity may communicate with the second cavity through at least one gas exchange channel such that, after the reflowing of the portion of fuse material, an atmosphere inside the second cavity corresponds to said controlled atmosphere. Thus, it is possible to manage the atmosphere of several cavities with at least one dedicated hole, and, for example, only one dedicated hole, made through the cap of only one of the cavities. Such gas exchange channel can guarantee exactly the same pressure in the different cavities whatever theirs volumes and their internal outgassing.

The second cavity may not communicate with the first cavity such that, after the reflowing of the portion of fuse material, an atmosphere inside the second cavity may correspond to an atmosphere in which the hermetically sealing of the second release hole is carried out.

The step of making the portion of wettable material, called first portion of wettable material, may also make a second portion of wettable material on the cap layer, above the second cavity, around a second blind hole intended to form a second dedicated hole and made through the outside surface of the cap layer before the making of the second portion of wettable material, or around a second part of said outside surface of the cap layer corresponding to a location of said second dedicated hole intended to be made, and the method may further comprise the following steps:

making a portion of a second fuse material at least on the second portion of wettable material;
making the second dedicated hole by etching at least the cap layer either through a bottom wall of the second blind hole or through said second part of the outside surface of the cap layer, said second dedicated hole emerging into the second cavity;
reflowing the portion of the second fuse material with a second controlled atmosphere, forming a bump of the second fuse material which hermetically plugs said second dedicated hole, an atmosphere inside the second cavity corresponding to said second controlled atmosphere.

In such configuration, the second fuse material may have a melting temperature which is different from the melting temperature of the other fuse material used to close the dedicated hole emerging into the first cavity. Thus, it is possible to close successively the two cavities with different controlled atmosphere, and thus enables to package different microelectronic devices with different controlled atmospheres. It is also possible to use the same fuse material to close the two cavities in order to close successively the two cavities with different controlled atmospheres, and thus enables to package different microelectronic devices with different controlled atmospheres.

The portion of fuse material may be made on the portion of wettable material but also around this portion of wettable material. In such configuration, the portion of wettable material may be ring-shaped, and the portion of fuse material may also be ring-shaped but may have a diameter higher than that of the portion of wettable material.

Dimensions of the dedicated hole in a plane parallel to said outside surface of the cap layer may be less than around 10 µm. Such dimensions can be obtained because the low topology over the cap.

The deposition of the portion of fuse material may be carried out with an electroplating or a sputtering of the fuse material.

The microelectronic device may be a MEMS or MOEMS or NEMS or NOEMS device.

BRIEF DESCRIPTION OF THE DRAWINGS

This invention will be easier to understand in view of the examples of embodiments provided purely for indicative and non-limiting purposes, in reference to the appended drawings wherein.

Identical, similar or equivalent parts of the different figures described below have the same numeric references for the sake of clarity between figures.

The different parts shown in the figures are not necessarily shown according to a uniform scale, so as to make the figures more legible.

The different possibilities (alternatives and embodiments) must be understood as being not mutually exclusive and can be combined with one another.

DETAILED DESCRIPTION OF PARTICULAR EMBODIMENTS

Reference is made to FIGS. 1A to 1K which represent steps of a method for packaging a microelectronic device 100 in a hermetically sealed cavity 110 and managing the atmosphere of the cavity 110 with a dedicated hole 130 according to a first embodiment. FIGS. 1A to 1K are cross-sectional side views of the packaging structure which is obtained with this method.

Figure 1A:
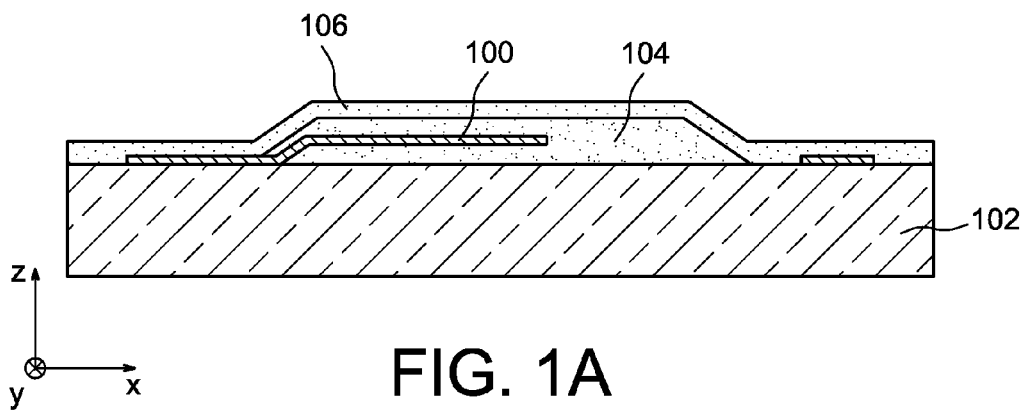
FIGS. 1A to 1K represent steps of a method for packaging at least one microelectronic device in at least one hermetically sealed cavity and managing the atmosphere of the cavity with at least one dedicated hole, object of the invention, according to a first embodiment.

As shown on FIG. 1A, the microelectronic device 100, here a MEMS device, is first made on a support 102. The support 102 is here a semiconductor-based substrate or wafer, e.g., silicon-based. The device 100 is then encapsulated with the implementation of a TFP process. A sacrificial material 104 is made on the support 102 and on the device 100. The sacrificial material 104 is shaped such that the volume of the sacrificial material 104 corresponds to the volume of the cavity 110 in which the device 100 is intended to be encapsulated. A cap layer 106 (corresponding to a single layer or a stack of several layers, e.g., thin layer(s) having a thickness lower than around 10 μm) is then deposited on the support 102, on the device 100 and on the sacrificial material 104. The sacrificial material 104 is chosen such that it can be selectively etched without damaging the materials of the device 100 and of the cap layer 106.

Figure 1B:
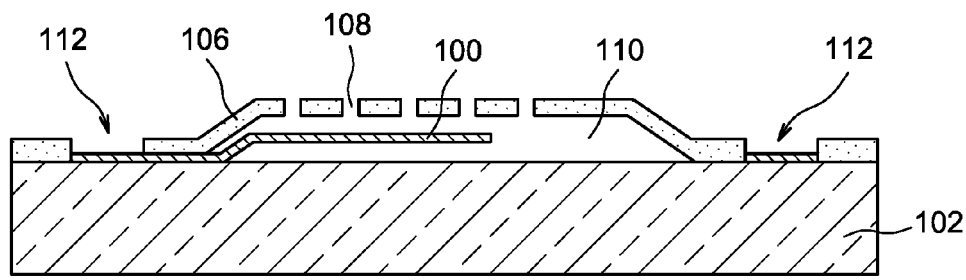

At least one release hole 108, here several release holes 108 are then etched through the cap layer 106, especially through a part of the cap layer intended to form an upper wall of the cavity 110 in which the device 100 is intended to be encapsulated. The sacrificial material 104 is then etched through the release holes 108, forming the cavity 110. Other apertures 112 may be etched through the cap layer 106 in order to form accesses to parts of the device 100 which are not encapsulated in the cavity 110, or to form accesses to electrical contact arranged on the support 102. In FIG. 1B, two apertures 112 made through the cap layer 106 form electrical accesses to the device 100. It is also possible that the cap layer 106 is etched such that only one portion of this cap layer 106 is kept on the support 102, this portion of the cap layer 106 forming the upper wall and the side walls of the cavity 110.

Figure 1C:
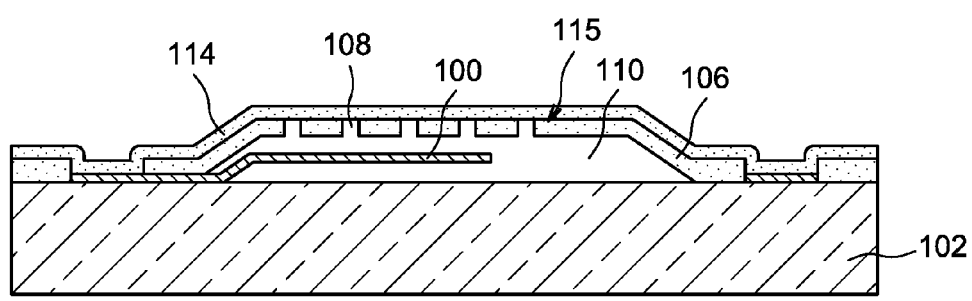

A shown in FIG. 1C, release holes 108 are then hermetically sealed with a deposition of a hermetic layer 114 on an outside surface 115 of the cap layer 106. The hermetic layer 114 can be a single layer, e.g., comprising Al, $SiO_2$ or SiN, or a stack of several layers, e.g., a stack of $SiO_2/Al_2O_3$ layers. The material(s) of the hermetic layer 114 may be chosen according to the sealing specifications (for example according to a minimum tolerated leak rate of the cavity 110). For instance, metal layer(s) can be used to improve the hermetic sealing of the release holes 108 and to guarantee high reliability of the packaged device. The deposition of the hermetic layer 114 can be carried out with controlled atmosphere, for example, with a pressure between vacuum (typically between $10^{-3}$ and $10^{-4}$ mbar) and up to 100 mbar and/or with a specific gas atmosphere. However, this controlled atmosphere can be different than the atmosphere in which the device 100 is intended to be definitively packaged because the management of the atmosphere inside the cavity 110 will be carried out later with the use of the dedicated hole 130.

Figure 1D:
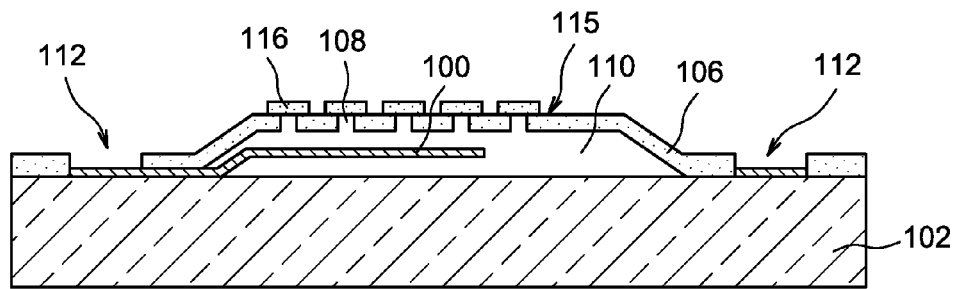
Figure 1E:
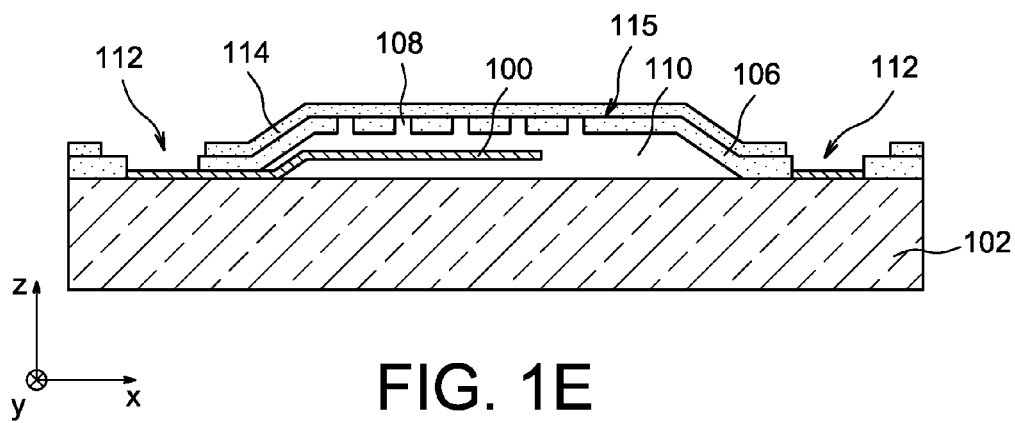

If necessary, the hermetic layer 114 may be patterned. As shown in FIG. 1D, the hermetic layer 114 is etched such that remaining portions 116 of the hermetic layer 114 close hermetically the release holes 108. Such etching is advantageously carried out when the hermetic layer 114 comprises one or several metals in order to reduce RF coupling with metal routing of the device 100. Alternately, as shown in FIG. 1E, only the apertures 112 can be made through the hermetic layer 114 in order to form the electrical accesses to the device 100 through the cap layer 106 and through the hermetic layer 114.

Such configuration enables to reinforce mechanically the cap layer 106 as the part of the hermetic layer 114 located above the cap of the cavity 110 is not etched.

Figure 1F:
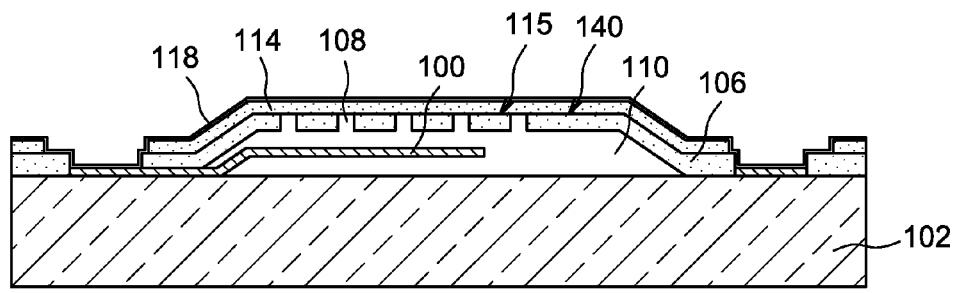

As shown in FIG. 1F, a layer of wettable material 118 is then deposited on the hermetic layer 114, or, if the hermetic layer 114 has been previously etched, on the remaining portions 116 of the hermetic layer 114 and on the outside surface 115 of the cap layer 106 between the portions 116. In the first embodiment here described, the layer of wettable material 118 is also deposited in the apertures 112. The wettable material may comprise Au and/or Cu. In addition, prior to the deposition of the layer of wettable material 118, an adhesion layer, e.g., corresponding to a layer of Ti or a bilayer of Ti/Ni, may be first deposited on the hermetic layer 104 (and eventually on the outside surface 115 of the cap layer 106), the layer of wettable material 118 being then deposited on this adhesion layer. A part of this layer of wettable material 118 which corresponds to a portion of wettable material 128 intended to be used to wet the fuse material during the closing of the dedicated hole 130 is arranged above a part 140 of the outside surface 115 of the cap layer 106 corresponding to the location of the dedicated hole 130.

Figure 1G:
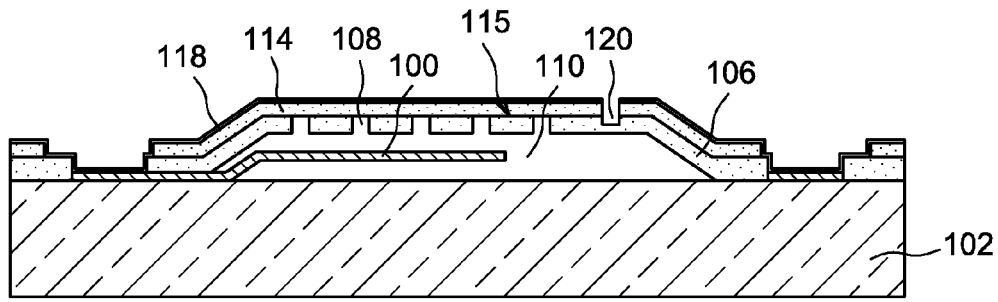

A blind hole 120 is then etched through the layer of wettable material 118 (and through the adhesion layer if such adhesion layer is arranged under the layer of wettable material 118), the hermetic layer 114 (or not if the blind hole 120 is located in an area in which the hermetic layer 114 has been previously etched) and a part of the thickness of the cap layer 106 (FIG. 1G). As this blind hole 120 will be used to make the dedicated hole 130, this blind hole 120 is made through the part 140 of the outside surface 115 of the cap layer 106. For example, a thickness between few nanometers and 500 nm of the cap layer 106 is kept to form the bottom wall of the blind hole 120. In the first embodiment here described, the blind hole 120 is made in an area of the cap layer 106 corresponding to a part of the upper wall of the cavity 110. For instance, the blind hole 120 is circular, that is has a disk-shaped section in a plane parallel to the outside surface 115 of the cap layer 106.

In a variant of the first embodiment, the blind hole 120 can be made before the deposition of the layer of wettable material 118. In this case, the wettable material may also be deposited in the blind hole 120, that is against side walls and bottom wall of the blind hole 120.

Figure 1H:
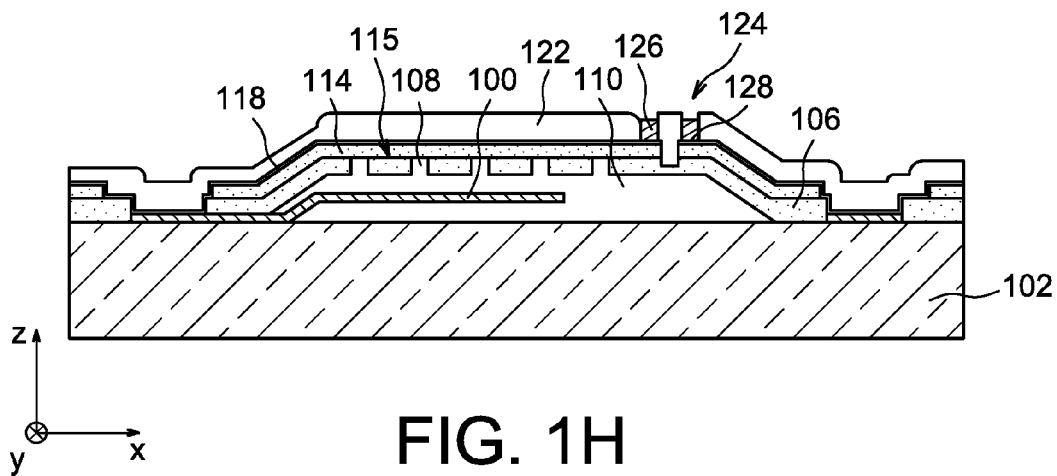

As shown in FIG. 1H, a photo resist layer 122 is then deposited on the layer of wettable material 118 and also in the blind hole 120. The photo resist layer 122 is then etched in order to form an opening 124 located around the blind hole 120 and above the portion of wettable material 128. In this embodiment, the shape of the opening 124, in the plane parallel to the outside surface 115 of the cap layer 106 (plane parallel to the plane (X,Y)), is a ring. A portion of fuse material 126 is then deposited in the opening 124. The shape of the portion of fuse material 126 corresponds to that of the opening 124. For instance, the fuse material is SnAgCu, or AuSn, or In. In this first embodiment, the portion of fuse material 126 is made by an electro-deposition process, the adhesion layer arranged under the layer of wettable material 118 forming a seed layer for this electro-deposition.

The photo resist layer 122 is then removed, for example with a wet process like a wet etching. Alternately, the portion of fuse material 126 may be made by lift-off. In this case, the fuse material is deposited in the opening 124 but also on the photo resist layer 122. The removing of the photo resist layer 122 then involves the removing of the fuse material except the portion of fuse material 126 located in the opening 124. According to another variant, the opening 124 can be located around the blind hole 120 but also regarding the blind hole 120 (the part of the photo resist layer 112 previously deposited in the blind hole 120 is also etched). In this case, the fuse material is also deposited in the blind hole 120.

The layer of wettable material 118 is then etched such that only the portion of wettable material 128 arranged under the portion of fuse material 126 is kept on the hermetic layer 114. Thus, in the plane parallel to the outside surface 115 of the cap layer 106, the shape of the portion of wettable material 128 is similar to the shape of the portion of fuse material 126. The layer of wettable material 118 can be etched with the implementation of a wet etching. In the example here described, the portion of wettable material 128 is arranged on the hermetic layer 114. However, it is possible that the portion of wettable material 128 is arranged directly on the outside surface 115 of the cap layer 106, for example when the hermetic layer 114 is etched as previously described in relation with FIG. 1D or if the hermetic layer 114 is not deposited on the part 140 of the outside surface 115 of the cap layer 106 at which the blind hole 120 is intended to be made.

Figure 1I:
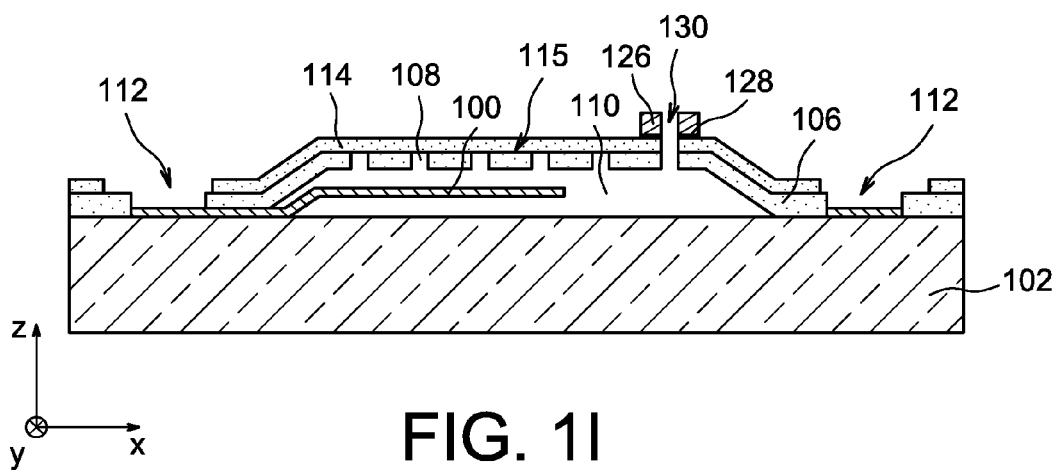

The bottom wall of the blind hole 120 is then etched, thus forming the dedicated hole 130 crossing the entire thickness of the cap layer 106 (FIG. 1I). The hole 130 thus forms a hole dedicated to the management of the final atmosphere of the cavity 110 in which the device 100 is intended to be packaged. If the fuse material has been deposited around the blind hole 120 and in the blind hole 120, the part of the fuse material located in the blind hole 120 is etched during the etching of the bottom wall of the blind hole 120. Similarly, if the wettable material has been deposited also in the blind hole 120, the part of the wettable material located in the blind hole 120 is etched during the etching of the bottom wall of the blind hole 120.

Figure 1J:
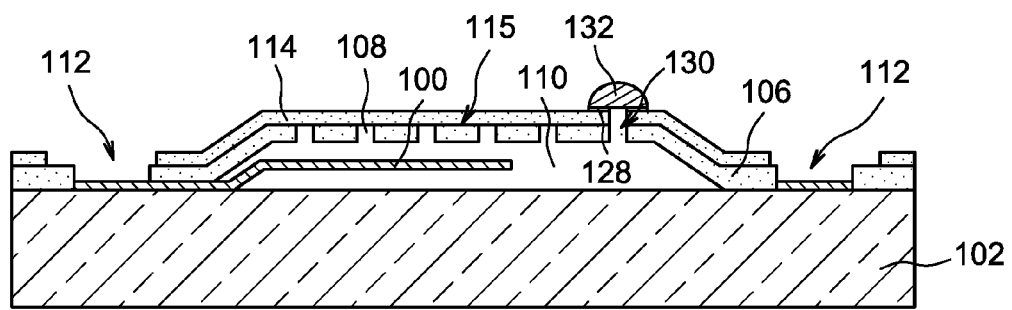

Finally, as shown in FIG. 1J, a reflow of the portion of fuse material 126 is carried with a controlled atmosphere by a heat treatment, forming a bump of fuse material 132 which is in contact only with the portion of wettable material 128 and which hermetically plugs the dedicated hole 130, an atmosphere inside the first cavity 110 corresponding to the controlled atmosphere in which the portion of fuse material 126 is reflowed. The temperature of the heat treatment carried out to reflow the fuse material is adapted according to the melting temperature of the fuse material (e.g., 156° C. for indium or 260° C. for SnAgCu fuse material). For example, the reflow process time may be in the range of one or two minutes at a temperature from about 30° to 40° upper than the melting point of the fuse material.

The controlled atmosphere in which this heat treatment is carried out corresponds to the atmosphere in which the microelectronic device 100 is intended to be encapsulated. For instance, the reflow of the fuse material can be carried out at a pressure higher than 100 mbar, or a pressure corresponding to vacuum (e.g., between $10^{-4}$ and $10^{-6}$ mbar). Moreover, the reflow may be carried out with an atmosphere comprising inert gas or gases, for instance, with a nitrogen or argon atmosphere. The reflowing step can be carried out in standard rapid thermal processing (RTP) equipment.

Figure 1K:
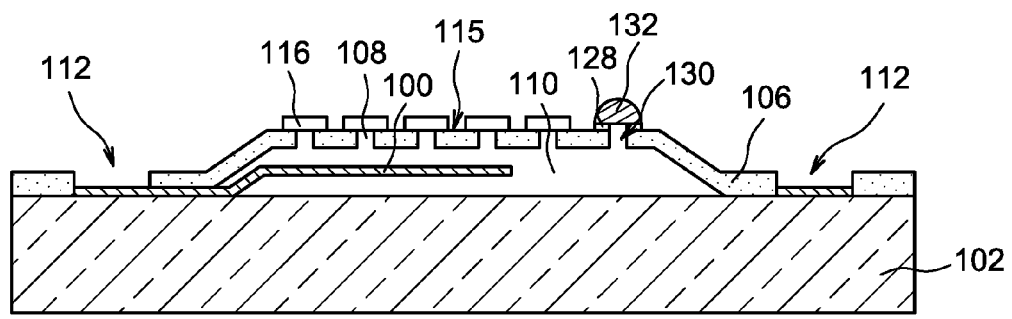

FIG. 1K represents the packaging structure obtained when the hermetic layer 114 is etched such that only remaining portions 116 of the hermetic layer 114 hermetically seal the release holes 108. In this configuration, the dedicated hole 130 is made only through the cap layer 106 and the portion of wettable material 128. The portion of wettable material 128 is arranged directly on the outside surface 115 of the cap layer 106.

Figure 2:
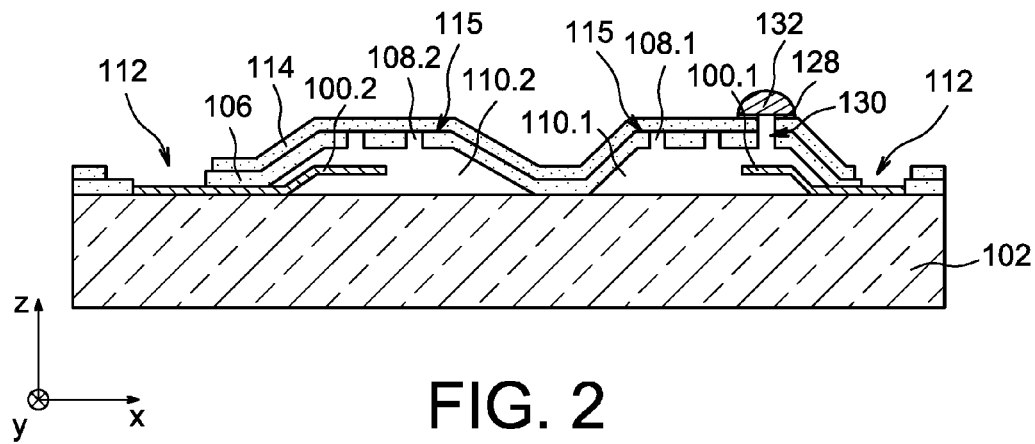
FIGS. 2 to 5 shown packaging structures obtained with the implementation of packaging methods, object of the invention, according to variants of the first embodiment.

As a variant of the first embodiment previously described, the packaging process previously described can be carried out for hermetically and collectively sealing several microelectronic devices in several cavities. As shown in FIG. 2, the cap layer 106 forms the caps of two different cavities 110.1 and 110.2 in which two microelectronic devices 110.1 and 110.2 are encapsulated. The second cavity 110.2 is hermetically sealed during the plugging of at least one second release hole 108.2 (here several second release holes 108.2 corresponding to the holes used to remove the sacrificial material which has been used to form the second cavity 110.2) obtained by the deposition of the hermetic layer 114. In the example here described, as the deposition of the hermetic layer 114 is carried under vacuum, the atmosphere of the second cavity 110.2 in which the second device 100.2 is encapsulated correspond to vacuum. No dedicated hole is formed through the cap layer 106 in order to manage the atmosphere of the second cavity 110.2 after the plugging of the second release holes 108.2.

The first cavity 110.1 is also hermetically sealed during the plugging of the release holes 108.1 (corresponding to the holes used to remove the sacrificial material which has been used to form the first cavity 110.1) obtained by the deposition of the hermetic layer 114. However, the dedicated hole 130 is then formed through the cap layer 130 in order to manage the atmosphere inside the first cavity 110.1 after the plugging of the release holes 108.1. The dedicated hole 130 may be formed as previously described in relation with FIGS. 1A to 1J. Thus, once the hole 130 is made through the entire thickness of the cap layer 106 (and also through the hermetic layer 114 in this example), it is possible to manage the atmosphere of the first cavity 110.1 without changing the atmosphere in the second cavity 110.2. The reflow of the portion of fuse material made around the hole 130 is carried out for example under atmospheric pressure. Thus, once the bump of fuse material 132 hermetically closes the hole 130, two cavities 110.1 and 110.2 with different atmospheric specifications are obtained.

According to another variant of the first embodiment, it is possible, after the sealing of the release holes 108.1 and 108.2, to manage independently the atmosphere of the two cavities 110.1 and 110.2. Such management can be carried out by making two dedicated holes 130.1 and 130.2 forming accesses to the two cavities 110.1 and 110.2. In order to plug one of these two holes 130.1 with first atmosphere specifications (pressure A and/or gas A into the first cavity 110.1)

in a first time, and then plug the other of the two holes 130.2 with second atmosphere specifications (pressure B≠A and/or gas B≠A into the second cavity 110.2) different than the first atmosphere specifications, two different fuse materials having different melting temperatures are used to plug the holes 130.1 and 130.2. The fuse material having the lowest melting temperature is used to close the first cavity 110.1. Thus, during the reflow of the portion of the first fuse material obtained with a heat treatment at a temperature which is higher than the melting temperature of the first fuse material but lower than the melting temperature of the second fuse material, the portion of the second fuse material is not reflowed. This first heat treatment transforms the portion of the first fuse material into a bump of the first fuse material 132.1 which plugs hermetically the first hole 130.1. A second heat treatment at a temperature higher than the melting temperature of the second fuse material is then carried out to reflow the portion of the second fuse material and to form a bump of the second fuse material 132.2 which plugs the second hole 130.2.

Figure 3:
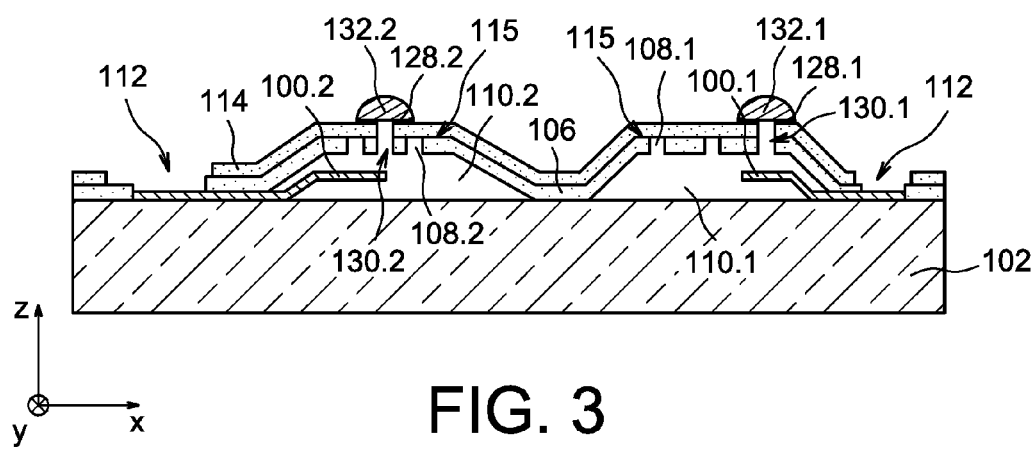

At the temperature of the second heat treatment, the first fuse material also reflow but that does not open the first hole 130.1, the tightness of the first cavity 110.1 being kept during this second heat treatment. Such configuration is shown in FIG. 3.

Alternately, it is possible to use the same fuse material to plug the holes 130.1 and 130.2. Indeed, during the reflowing of the portion of fuse material, a part of the portion of wettable material in contact with the fuse material is dissolved in the fuse material, thus forming intermetallics in the bump of fuse material. As these intermetallics have a melting temperature which is higher than that of the original fuse material (that is without these intermetallics), it is possible to close hermetically a first of the two cavities 110.1, 110.2, e.g., the first cavity 110.1, with a reflowing of the first portion of fuse material, thus creating the first bump of fuse material 132.1 which comprises intermetallics. The second cavity 110.2 may then be closed with a second heat treatment which reflows the second portion of fuse material (which is made on the cap after the reflowing of the first portion of fuse material), thus creating the second bump of fuse material 132.2, without reflowing the first bump of fuse material 132.1 as intermetallics are included in this first bump of fuse material 132.1.

Figure 4A:
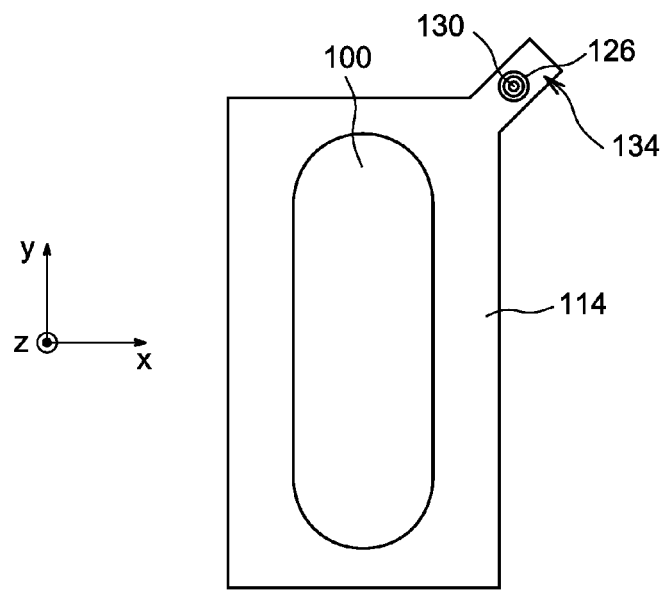
Figure 4B:
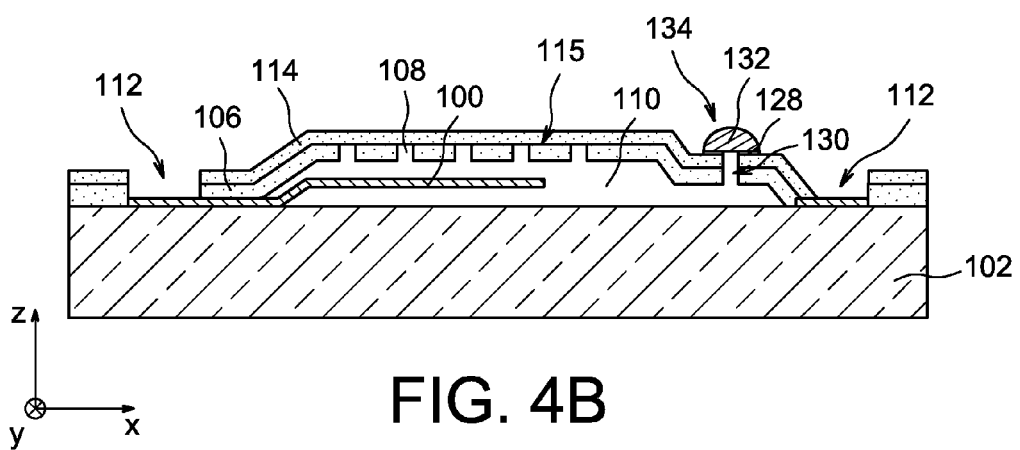

Advantageously, the hole which is dedicated to the management of the atmosphere after the sealing of the release holes is arranged in a peripheral area of the cavity such that the microelectronic device encapsulated in the cavity is not facing said peripheral area of the cavity. Such configuration is shown in FIGS. 4A (top side view) and 4B (cross-section side view) on which a peripheral area 134 far from the microelectronic device 100 is made. This peripheral area 134 is formed by the same layers as those forming the walls of the cavity 100, here the cap layer 106 and the hermetic layer 114.

The distance between the hole 130 made in such peripheral area 134 and the microelectronic device 100 is equal or higher than around 50 μm.

In the different examples previously described, a single dedicated hole 130 is made to manage of the atmosphere of the cavity in order to reach the highest yield and reliability performances. However, it is possible to make several holes 130 dedicated to the management of the atmosphere of the cavity 110, especially when the diameter of the holes, in order to reach the targeted pressure in a short time (few seconds), or for high volume cavity.

Moreover, in order to reach low vacuum specification or high reliability, a getter material can be added in the cavity 110.

Figure 5:
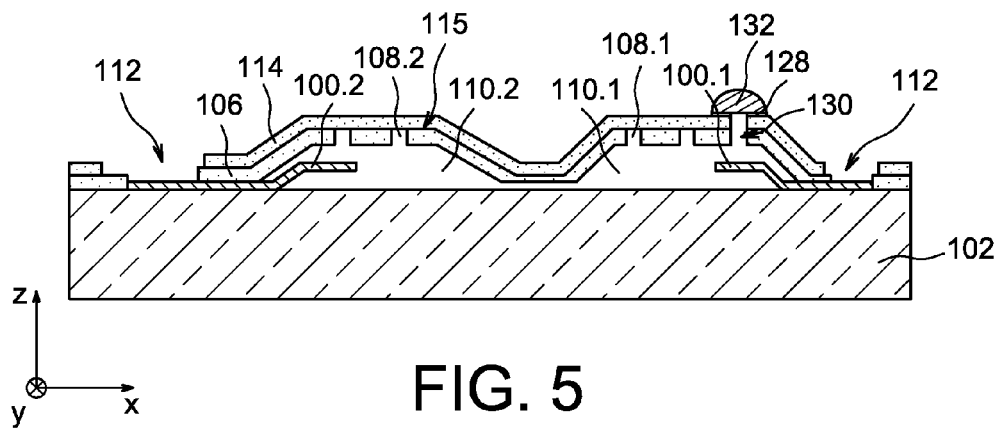

Several cavities can also be connected with one or several gas exchange channels such that only one dedicated hole plugged with a fuse material enables to control and manage the atmosphere of these cavities. As shown in FIG. 5, the atmospheres of the two cavities 110.1 and 110.2 communicate one with the other through a gas exchange channel 136 formed between the support 102 and the cap layer 106. In such configuration, the hole 130 enables to manage the atmosphere of both cavities 110.1 and 110.2. The gas exchange channel 136 guarantee exactly the same pressure and the same gas composition in both cavities 110.1 and 110.2 whatever their volumes and their internal out-gassing.

The different variants previously described can be combined one with the other.

A method for packaging a microelectronic device in a hermetically sealed cavity and managing the atmosphere of the cavity with a dedicated hole according to a second embodiment is now described.

First, steps previously described in relation with FIGS. 1A to 1F are carried out in order to form the cavity 110 in which the release holes 108 are sealed with the hermetic layer 114, and with the layer of wettable material 118 arranged over the hermetic layer 114.

Figure 6A:
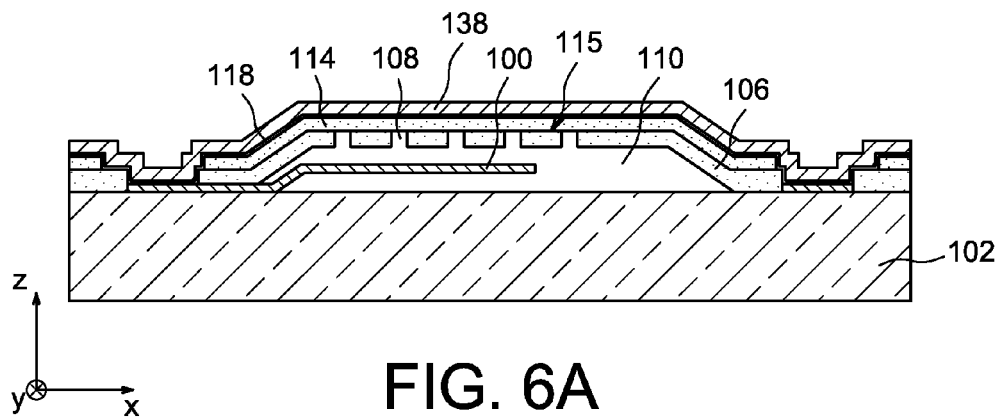
FIGS. 6A and 6B represent steps of a method for packaging at least one microelectronic device in at least one hermetically sealed cavity and managing the atmosphere of the cavity with at least one dedicated hole, object of the invention, according to a second embodiment.

As shown in FIG. 6A, a layer of fuse material 138 is then made, for example, by electro-deposition on the layer of wettable material 118.

Figure 6B:
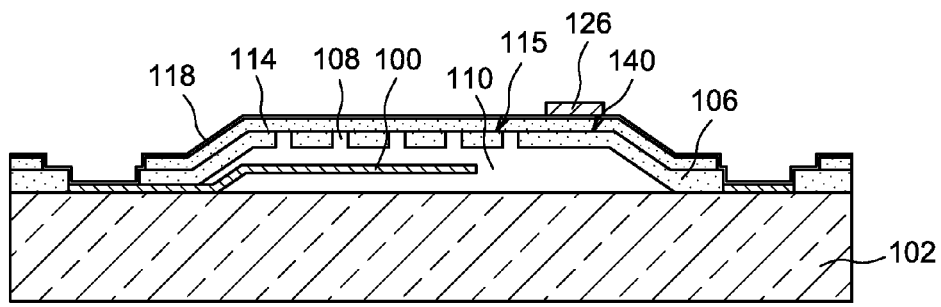

The layer of fuse material 138 is then patterned, e.g. by an etching step, such that the remaining portion 126 of fuse material is arranged above a location of the dedicated hole 130 intended to be made to manage the atmosphere of the cavity 110, that is above the part 140 of the outside surface 115 of the cap layer 106 (FIG. 6B).

The layer of wettable material 118 is then etched in order to keep only the portion of wettable material 128 which is arranged under the portion of fuse material 126 and above the part 140 of the outside surface 115 of the cap layer 106 corresponding to the location of the dedicated hole 130 intended to be made. The dedicated hole 130 is then made by etching through the portion of fuse material 126, the portion of wettable material 128, the hermetic layer 114 and through the entire thickness of the cap layer 106. The obtained structure corresponds to that represented in FIG. 1I.

The method is then achieved as previously described for the first embodiment, that is by carrying out a reflow of the portion of fuse material 126 under controlled atmosphere in order to obtained a sealed cavity 110 in which the device 100 is encapsulated with the desired atmosphere.

The variants previously described in relation with the first embodiment also apply to this second embodiment.

The packaging processes previously described may be carried out at wafer level, that is carried out for packaging simultaneously several microelectronic devices made on the same support 102 in several cavities. A cost effective packaging process is thus obtained.

The invention claimed is:

1. A method for packaging at least one microelectronic device in at least one hermetically sealed cavity and managing an atmosphere of the cavity with at least one dedicated hole, comprising:
    making said cavity between a support and at least one cap layer such that a sacrificial material and the microelectronic device are arranged in the cavity;

removing the sacrificial material through at least one release hole made through the cap layer, and hermetically sealing the release hole;

making a portion of wettable material on the cap layer, around a blind hole intended to form said dedicated hole, said blind hole being made through an outside surface of the cap layer before the making of the portion of wettable material, or around a part of said outside surface of the cap layer corresponding to a location of said dedicated hole intended to be made;

making a portion of fuse material at least on the portion of wettable material;

after making the portion of the fuse material, making the dedicated hole by etching at least the cap layer either through a bottom wall of the blind hole or through said part of the outside surface of the cap layer, said dedicated hole emerging into the cavity; and reflowing the portion of fuse material with a controlled atmosphere, forming a bump of fuse material which hermetically plugs said dedicated hole, an atmosphere inside the cavity corresponding to said controlled atmosphere.

2. The method according to claim 1, wherein the blind hole or the part of the outside surface of the cap layer is arranged in a peripheral area of the cavity such that the microelectronic device is not facing said peripheral area of the cavity.

3. The method according to claim 1, wherein the making of the portion of wettable material comprises:

deposition of a layer of wettable material on said outside surface of the cap layer;

etching a part of the layer of wettable material such that a remaining portion of the layer of wettable material corresponds to the portion of wettable material.

4. The method according to claim 3, wherein the etching of the part of the layer of wettable material is carried out after the making of the portion of fuse material.

5. The method according to claim 3, wherein an adhesion layer is first deposited on the outside surface of the cap layer before the deposition of the layer of wettable material which is then deposited on said adhesion layer.

6. The method according to claim 5, wherein the portion of fuse material is made by electro-chemical deposition, the adhesion layer forming a seed layer for the growth of the fuse material during the electro-chemical deposition.

7. The method according to claim 1, wherein the making of the portion of fuse material comprises:

deposition of a photo resist layer on the outside surface of the cap layer and on the portion of wettable material;

etching a part of the photo resist layer, forming an opening through the photo resist layer and located at least above the portion of wettable material;

and wherein the portion of fuse material is then formed in said opening by deposition, and wherein the photo resist layer is removed after the making of the portion of fuse material.

8. The method according to claim 1, further comprising, when the portion of wettable material is made around the part of said outside surface of the cap layer corresponding to the location of said dedicated hole intended to be made, making the blind hole through said part of the outside surface of the cap layer which is carried out between the making the portion of wettable material and the making the portion of fuse material.

9. The method according to claim 1, wherein, when no blind hole is made through the outside surface of the cap layer, the dedicated hole is made by etching at least the cap layer, the portion of wettable material and the portion of fuse material.

10. The method according to claim 1, wherein the hermetically sealing of the release hole comprises the deposition of an hermetic layer above the cap layer and above the release hole, wherein the portion of wettable material is made on said hermetic layer and wherein the dedicated hole is made through said hermetic layer.

11. The method according to claim 1, wherein the making the cavity, called first cavity, and the removing the sacrificial layer are carried out such that these steps also make at least a second cavity between the support and the cap layer and comprising hermetically sealing at least one second release hole.

12. The method according to claim 11, wherein the first cavity communicates with the second cavity through at least one gas exchange channel such that, after the reflowing of the portion of fuse material, an atmosphere inside the second cavity corresponds to said controlled atmosphere.

13. The method according to claim 11, wherein the second cavity does not communicate with the first cavity such that, after the reflowing of the portion of fuse material, an atmosphere inside the second cavity corresponds to an atmosphere in which the hermetically sealing of the second release hole is carried out.

14. The method according to claim 11, wherein the making the portion of wettable material, called first portion of wettable material, also makes a second portion of wettable material on the cap layer, above the second cavity, around a second blind hole intended to form a second dedicated hole and made through the outside surface of the cap layer before the making of the second portion of wettable material, or around a second part of said outside surface of the cap layer corresponding to a location of said second dedicated hole intended to be made, the method further comprising:

making a portion of a second fuse material at least on the second portion of wettable material;

making the second dedicated hole by etching at least the cap layer either through a bottom wall of the second blind hole or through said second part of the outside surface of the cap layer, said second dedicated hole emerging into the second cavity;

reflowing the portion of the second fuse material with a second controlled atmosphere, forming a bump of the second fuse material which hermetically plugs said second dedicated hole, an atmosphere inside the second cavity corresponding to said second controlled atmosphere.

* * * * *